(12) United States Patent
Liu et al.

(10) Patent No.: US 7,180,181 B2
(45) Date of Patent: *Feb. 20, 2007

(54) MESH SHAPED DAM MOUNTED ON A SUBSTRATE

(75) Inventors: Pai-Chou Liu, Kaohsiung (TW); Sheng-Tsung Liu, Kaohsiung (TW); Wei-Chang Tai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 85 days.

This patent is subject to a terminal disclaimer.

(21) Appl. No.: 10/933,348

(22) Filed: Sep. 3, 2004

(65) Prior Publication Data

US 2005/0082680 A1   Apr. 21, 2005

(30) Foreign Application Priority Data

Sep. 4, 2003   (TW)   ............... 92124509 A

(51) Int. Cl.
*H01L 23/34*   (2006.01)
*H05K 7/10*   (2006.01)
(52) U.S. Cl. ............... 257/724; 257/738; 257/780; 257/E23.135; 361/770; 361/771
(58) Field of Classification Search ............... None
See application file for complete search history.

(56) References Cited

U.S. PATENT DOCUMENTS 5,726,501 A * 3/1998 Matsubara ............... 257/778
5,796,590 A * 8/1998 Klein ............... 361/774
5,929,521 A * 7/1999 Wark et al. ............... 257/737
6,084,781 A * 7/2000 Klein ............... 361/771
6,833,615 B2 * 12/2004 Geng et al. ............... 257/698
6,921,860 B2 * 7/2005 Peterson et al. ............... 174/52.2
2005/0087867 A1 * 4/2005 Liu ............... 257/738

FOREIGN PATENT DOCUMENTS

JP    200386928 A  *  3/2003
TW    466719          12/2001
WO    WO96/08056  *  3/1996

* cited by examiner

*Primary Examiner*—Alonzo Chambliss
(74) *Attorney, Agent, or Firm*—Troxell Law Office, PLLC

(57) ABSTRACT

A substrate is provided for carrying at least a semiconductor device. The substrate mainly includes a carrier body, a plurality of contact pads, a solder mask and a plurality of dams of a mesh. The contact pads are disposed on a surface of the carrier body and each has a bonding surface exposed out of the solder mask for connecting with the external terminals of the semiconductor device. The dams are disposed above the surface of the carrier body. The dams protrude from and located between the bonding surfaces of the contact pads to prevent solder paste, flux or the external terminals of the semiconductor device from bridging.

19 Claims, 4 Drawing Sheets

MESH SHAPED DAM MOUNTED ON A SUBSTRATE

FIELD OF THE INVENTION

The present invention relates to a substrate for semiconductor packages, more particularly to a substrate with a mesh.

BACKGROUND OF THE INVENTION

Currently with respect to different IC devices and application requests, the package configurations for packaging IC devices direct to Flip Chip Package, CSP (Chip Scale Package), WLCSP (Wafer Level Chip Scale Package) and DCA (Direct Chip Attach). Utilizing packaging techniques mentioned above, a plurality of semiconductor devices with same or different electrical functions can be packaged together to form a MCM (Multi-Chip Module), MPM (Multi-Package Module) or MCP ((Multi-Chip Package) to achieve larger capacity or better electrical functions.

However, the dimensions of semiconductor devices become smaller with higher pin counts, moreover, the terminal pitch of the semiconductor devices also becomes smaller. Substrates for carrying the semiconductor devices often suffer from bridging problem in interconnection with the semiconductor devices.

A conventional substrate for carrying semiconductor chips and sub-packages is disclosed in R.O.C. Taiwan Patent No. 466,719. Referring to FIG. 1, a semiconductor package 10 includes a substrate 11 having a planar upper surface for carrying a plurality of sub-packages 12 or chips. The substrate 11 has a plurality of contact pads 11a on the planar upper surface corresponding to a plurality of external terminals 12a of sub-packages 12. The external terminals 12a may be either bumps or solder balls. When one of sub-packages 12 having a high pin count or replaced by a flip chip with fine pitch bumps, the pad pitch of the contact pads 11a of the substrate 11 should be smaller. Normally a reflowing step is demanded to connect the external terminals 12a with the contact pads 11a, a bridging problem probably occurs between the contact pads 11a and the external terminals 12a by solder paste or flux coated on the contact pads 11a and eventually create shorts in the semiconductor package 10.

SUMMARY

It is a primary object of the present invention to provide a substrate with a mesh for carrying at least a semiconductor device. The mesh consists of a plurality of dams formed on a solder mask of the substrate and located between a plurality of contact pads of the substrate for blocking the solder paste or flux so as to prevent from bridging at external terminals of the semiconductor device.

The substrate having a mesh is provided in accordance with the present invention. The substrate generally includes a carrier body, a plurality of contact pads, a solder mask and a plurality of dams of the mesh. The carrier body has a surface for carrying at least a semiconductor device with a plurality of external terminals. The contact pads are disposed on the surface of the substrate, each has a bonding surface exposed out of the solder mask for connecting the external terminals of the semiconductor device. The dams are formed on the solder mask by printing technique and located between the bonding surfaces of the contact pads. In one embodiment, the dams are the boundaries of a single-color checkerboard and made from another solder mask stacked on the underlying solder mask. Preferably, the dams protrude from the bonding surfaces of the contact pads and have a height between about 0.02 mm and about 0.1 mm for blocking the solder paste or flux so as to prevent from bridging at the external terminals of the semiconductor device. Moreover, a semiconductor package including the substrate mentioned above is provided.

DETAILED DESCRIPTION OF THE PRESENT INVENTION

Figure 1:
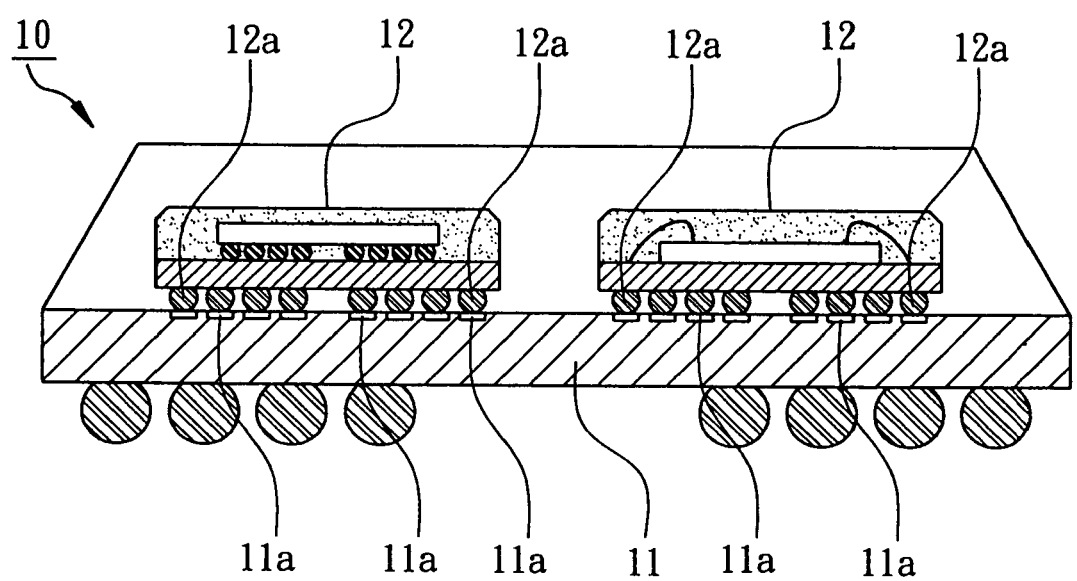
FIG. 1 is a cross-sectional view of a known semiconductor package.

Referring to the drawings attached, the present invention is described by means of the embodiment(s) below.

Figure 2:
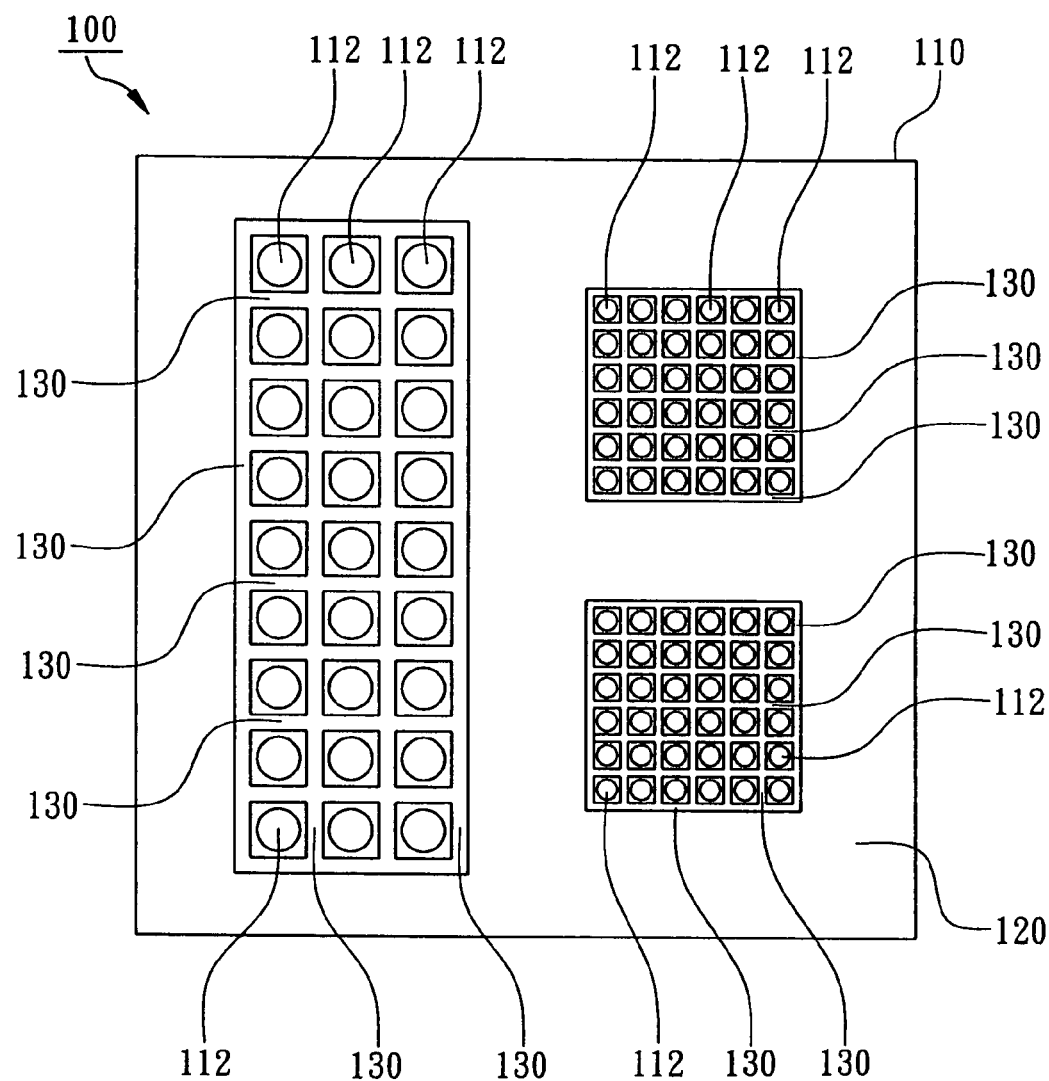
FIG. 2 is a top view of a substrate with a mesh in accordance with the embodiment of the present invention.
Figure 3:
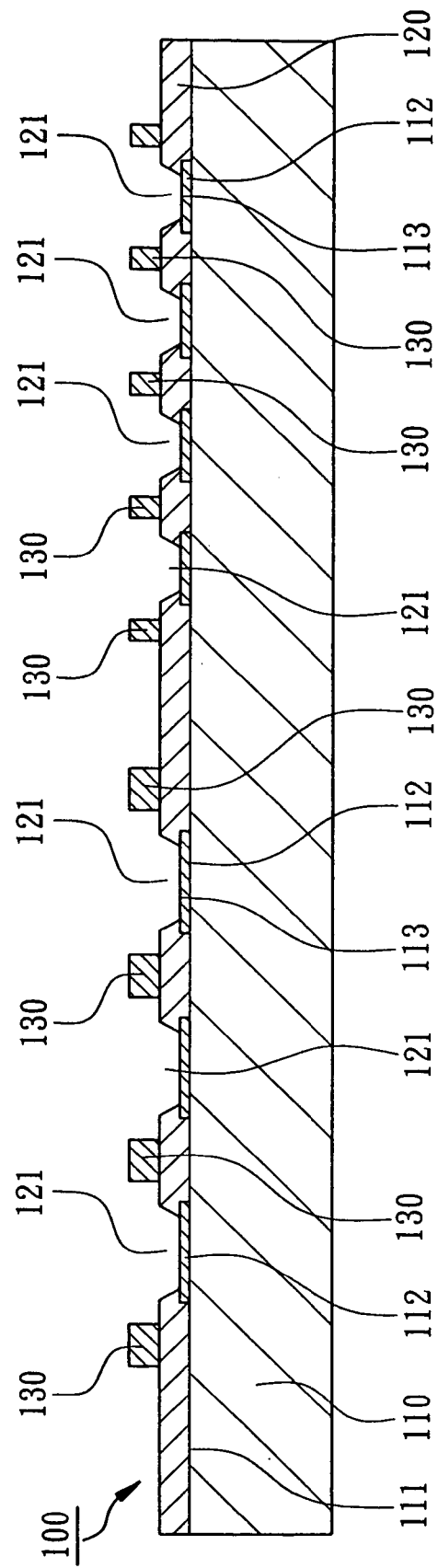
FIG. 3 is a cross-sectional view of the substrate with a mesh in accordance with the embodiment of the present invention.
Figure 4:
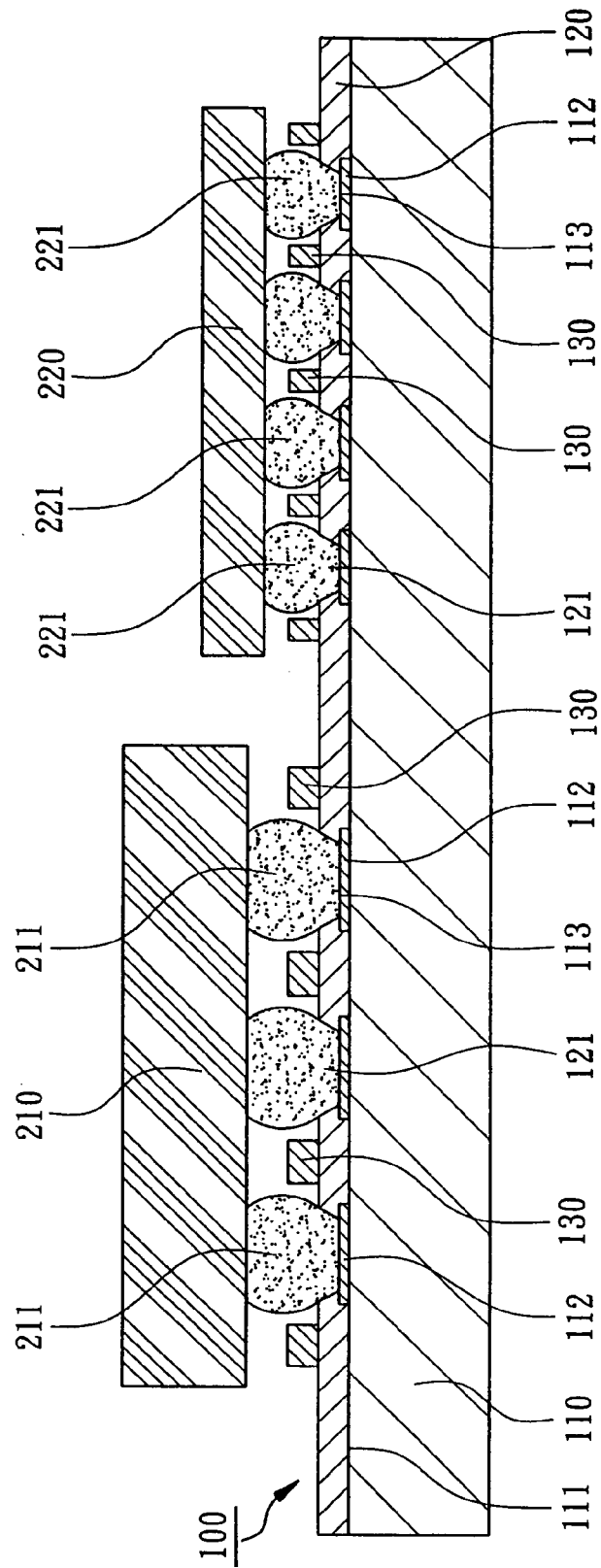
FIG. 4 is a cross-sectional view of a semiconductor package with the substrate in accordance with the embodiment of the present invention.

According to the embodiment of the present invention, a substrate 100 with at least a mesh is provided. FIG. 2 shows a top view of the substrate 100. FIG. 3 shows a cross-sectional view of the substrate 100. FIG. 4 shows a cross-sectional view of a semiconductor package utilizing the substrate 100. Referring to FIGS. 2 and 3, the substrate 100 includes a carrier body 110, a plurality of contact pads 112, a solder mask 120 and a plurality of dams 130. The substrate 100 may be a single layer or multi-layer printed circuited board using glass fiber reinforced resin, such as FR-4, FR-5 or BT resin, or flexible board made of polyimide, as the carrier body 110. The carrier body 110 has a surface 111 for carrying at least a semiconductor device 220 (as showed in FIG. 4). The contact pads 112 are disposed on the surface 111 to electrically connect the circuitry of the carrier body 110. In this embodiment, the contact pads 112 are arranged in a checkerboard configuration.

The solder mask 120 is formed on the surface 111 of the carrier body 110 and has a plurality of openings 121 corresponding to the contact pads 112. Therefore, each contact pad 112 has a bonding surface 113 exposed out of the solder mask 120 for connecting the external terminal 221 of the semiconductor device 220 (as showed in FIG. 4). In the embodiment, the openings 121 of the solder mask 120 are smaller than the contact pads 112 for defining the area of the bonding surfaces 113, so that the contact pads 112 can be SMD pads (Solder Mask Define pads). Alternatively, the contact pads 112 may be NSMD pads (None Solder Mask Define pads). The NSMD pads mean that the openings 121 of the solder mask 120 are larger than the contact pads 112 so that the area of the bonding surface 113 of the contact pads 112 cannot be defined by the openings 121 of the solder mask 120 (not shown in figures). The contact pads 112 should match the external terminals of semiconductor device with fine pitch layout.

Referring FIGS. 2 and 3 again, the dams 130 are formed in a mesh configuration and on the solder mask 120 by means of printing or attaching method. Moreover the dams 130 are located between the bonding surfaces 113 of the contact pads 112. Therefore the dams 130 protrude from the bonding surfaces 113 of the contact pads 112. But not limited, the dams 130 also can be formed on the surface 111 of the substrate 110 and covered by the solder mask 120 (not shown in figures). The dams 130 are made of a dielectric material, such as polyimide or with same material as the solder mask 120. Preferably the dams 130 are made from another solder mask stacked on the underlying solder mask 120. Preferably, the dams 130 are the boundaries of a single-color checkerboard, such as GO board. The dams 130 can be connected to each other or disconnected from each other. Besides, the dams 130 should not cover the bonding surfaces 113 of the contact pads 112 and have a height ranging between about 0.02 mm and about 0.1 mm for blocking solder paste or flux to prevent from bridging on the bonding surfaces 113 or the external terminals 221 of the semiconductor device 220 (as showed in FIG. 4).

Referring to FIG. 4, the semiconductor package 200, typically is MCM (Multi-chip Module) or MCP (Multi-chip Package), utilizes the foregoing substrate 100. The semiconductor package 200 includes the foregoing substrate 100 and at least a semiconductor device 210. In this embodiment, the substrate 100 is a MCM substrate for carrying a plurality of the semiconductor devices 210 and 220 with sub-package or flip-chip configurations. The semiconductor devices 210 and 220 may be flip chips, CSP (Chip Scale Package), WLCSP (Wafer Level Chip Scale Package), BGA package or chips mounted by DCA technique. The substrate 100 has a plurality of mesh corresponding to the semiconductor devices 210 and 220. In this embodiment, the semiconductor device 210 is a sub-package, and the semiconductor device 220 is a flip chip. The semiconductor device 210 has a plurality of external terminals 211 and is disposed on the surface 111 of the substrate 100 above one of the meshes. The external terminals 211 can include solder balls to connect the bonding surfaces 113 of the contact pads 112 on the substrate 100. Likewise, another semiconductor device 220 also has a plurality of external terminals 221 for connecting the bonding surfaces 121. In order to enable the bonding surfaces 113 of the contact pads 112 to match the external terminals 211 and 221 of the semiconductor devices 210 and 220, the contact pads 112 in different mesh have predetermined pitches. Likewise, the plurality of meshes made of the dams 130 also have different openings (as showed in FIG. 3) to expose each bonding pads 112 in proper dimension for blocking solder paste or flux so as to prevent the external terminals 211 and 221 of the semiconductor devices 210 and 220 from bridging. Moreover, the heights of the dams 130 should be designated not to be taller than the heights of the external terminals 211 and 221, so that the dams 130 do not contact with the semiconductor devices 210 and 220. An encapsulant can seal the semiconductor devices 210 and 220 and fill the spacing between the semiconductor devices 210 and 220 and the substrate 110.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A substrate comprising:
   a carrier body having a surface for carrying at least a semiconductor device;
   a plurality of contact pads disposed on the surface of the carrier body;
   a solder mask formed on the surface of the carrier body and having a plurality of openings exposing the contact pads; and
   a plurality of dams formed on the solder mask and located between the contact pads, the dams being made from another solder mask stacked on the underlying solder mask.

2. The substrate in accordance with claim 1, wherein a height of the dams ranges between about 0.02 mm and about 0.1 mm.

3. The substrate in accordance with claim 1, wherein the dams are the boundaries of a single-color checkerboard.

4. The substrate in accordance with claim 1, wherein the dams are made of polyimide.

5. The substrate in accordance with claim 1, wherein the dams are connected to each other.

6. The substrate in accordance with claim 1, wherein the dams are disconnected from each other.

7. The substrate in accordance with claim 1, wherein each contact pad has a bonding surface exposed out of the solder mask, the dams protrude from the bonding surfaces of the contact pads.

8. The substrate in accordance with claim 7, wherein the openings of the solder mask are smaller than the contact pads for defining the area of the bonding surfaces.

9. A semiconductor package comprising:
   a substrate comprising:
   a carrier body having a surface;
   a plurality of contact pads disposed on the surface of the carrier body;
   a solder mask formed on the surface of the carrier body and having a plurality of openings exposing the contact pads; and
   a plurality of dams formed on the solder mask and located between the contact pads, the dams being made from another solder mask stacked on the underlying solder mask; and
   at least a semiconductor device disposed on the substrate and having a plurality of external terminals, the external terminals being connected to the bonding surfaces of the contact pads.

10. The semiconductor package in accordance with claim 9, wherein a height of the dams ranges between about 0.02 mm and about 0.1 mm.

11. The semiconductor package in accordance with claim 9, wherein the dams do not contact with the semiconductor device.

12. The semiconductor package in accordance with claim 9, wherein the dams are the boundaries of a single-color checkerboard.

13. The semiconductor package in accordance with claim 9, wherein the dams are made of polyimide.

14. The semiconductor package in accordance with claim 9, wherein the dams are connected to each other.

15. The semiconductor package in accordance with claim 9, wherein the dams are disconnected from each other.

16. The semiconductor package in accordance with claim 9, wherein the dams protrude from the bonding surfaces of the contact pads.

17. The semiconductor package in accordance with claim 16, wherein the openings of the solder mask are smaller than the contact pads for defining the area of the bonding surfaces.

18. The semiconductor package in accordance with claim 9, wherein the semiconductor device is selected from the group consisting of Chip Scale Package, flip chip and BGA package.

19. The semiconductor package in accordance with claim 9, wherein the external terminals of the semiconductor device includes solder balls.

* * * * *